(12) United States Patent
Darveaux et al.

(10) Patent No.: US 7,126,218 B1
(45) Date of Patent: Oct. 24, 2006

(54) EMBEDDED HEAT SPREADER BALL GRID ARRAY

(75) Inventors: Robert F. Darveaux, Higley, AZ (US); Frederick J. G. Hamilton, Chandler, AZ (US); Bruce M. Guenin, Glibert, AZ (US); Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 600 days.

(21) Appl. No.: 09/923,834

(22) Filed: Aug. 7, 2001

(51) Int. Cl.
*H01L 23/10* (2006.01)
*H01L 23/34* (2006.01)

(52) U.S. Cl. .................. 257/706; 257/707; 257/691; 257/787; 257/718; 257/778; 257/796

(58) Field of Classification Search ............ 257/706, 257/707, 712, 713, 718, 720, 726, 727, 787, 257/788, 796
See application file for complete search history.

(56) References Cited

U.S. PATENT DOCUMENTS

| | | | |
|---|---|---|---|
| 5,041,902 A | 8/1991 | McShane .................. 357/79 |
| 5,166,772 A | 11/1992 | Soldner et al. | |
| 5,200,809 A | 4/1993 | Kwon | |
| 5,328,870 A | 7/1994 | Marrs .................. 437/216 |
| 5,355,283 A | 10/1994 | Marrs et al. ............... 361/760 |
| 5,365,107 A | 11/1994 | Kuraishi et al. | |
| 5,381,042 A | 1/1995 | Lerner et al. ............. 257/712 |
| 5,422,435 A | 6/1995 | Takiar et al. | |
| 5,455,462 A | 10/1995 | Marrs .................. 257/796 |
| 5,471,011 A | 11/1995 | Maslakow ................ 174/52.4 |
| 5,478,007 A | 12/1995 | Marrs .................... 228/180.22 |
| 5,482,898 A * | 1/1996 | Marrs .................. 437/216 |
| 5,485,037 A | 1/1996 | Marrs .................. 257/712 |
| 5,530,202 A | 6/1996 | Dais et al. | |
| 5,566,051 A * | 10/1996 | Burns .................... 361/704 |
| 5,583,378 A | 12/1996 | Marrs et al. ............... 257/710 |
| 5,616,957 A * | 4/1997 | Kajihara .................. 257/712 |
| 5,629,561 A | 5/1997 | Shin et al. ............... 257/712 |
| 5,650,663 A | 7/1997 | Parthasarathi ............. 257/706 |
| 5,656,864 A | 8/1997 | Mitsue et al. | |
| 5,739,581 A | 4/1998 | Chillara et al. | |
| 5,783,860 A | 7/1998 | Jeng et al. ............... 257/675 |
| 5,854,511 A * | 12/1998 | Shin et al. ............... 257/713 |
| 5,929,513 A | 7/1999 | Asano et al. ............. 257/675 |
| 5,929,514 A * | 7/1999 | Yalamanchili ........... 257/676 |
| 5,977,626 A * | 11/1999 | Wang et al. .............. 257/707 |
| 6,008,991 A * | 12/1999 | Hawthorne et al. ........ 361/707 |
| 6,028,354 A * | 2/2000 | Hoffman .................. 257/706 |
| 6,069,023 A * | 5/2000 | Bernier et al. ............. 438/107 |

(Continued)

FOREIGN PATENT DOCUMENTS

JP  60182731  9/1985

(Continued)

*Primary Examiner*—Nathan J. Flynn
*Assistant Examiner*—Fazli Erdem
(74) *Attorney, Agent, or Firm*—Gunnison, McKay & Hodgson, L.L.P.; Serge J. Hodgson

(57) ABSTRACT

A heat slug or spreader is attached directly to a surface of the die in a ball grid array (BGA) package. The heat spreader roughly conforms to the topological profile of the die, underlying substrate, and electrical interconnections between the die and the substrate, such as bond wires. The outer portion of the heat spreader substantially cover the outer portion of the substrate, or alternatively, cover only those portions extending in laterally from the sides of the chip and not the corners. An encapsulant completely covers the heat spreader and die.

48 Claims, 2 Drawing Sheets

U.S. PATENT DOCUMENTS

| | | | |
|---|---|---|---|
| 6,093,960 A | 7/2000 | Tao et al. | 257/706 |
| 6,133,637 A | 10/2000 | Hikita et al. | |
| 6,166,446 A | 12/2000 | Masaki | 257/796 |
| 6,198,163 B1 | 3/2001 | Crowley et al. | 257/706 |
| 6,229,702 B1* | 5/2001 | Tao et al. | 361/704 |
| 6,246,115 B1 | 6/2001 | Tang et al. | |
| 6,258,629 B1 | 7/2001 | Niones et al. | 438/111 |
| 6,262,480 B1* | 7/2001 | Ferri et al. | 257/706 |
| 6,326,696 B1 | 12/2001 | Horton et al. | |
| 6,400,014 B1* | 6/2002 | Huang et al. | 257/712 |
| 6,429,512 B1 | 8/2002 | Huang et al. | |
| 6,853,070 B1* | 2/2005 | Khan et al. | 257/707 |
| 2002/0109226 A1* | 8/2002 | Khan et al. | 257/737 |
| 2002/0171144 A1* | 11/2002 | Zhang et al. | 257/738 |

FOREIGN PATENT DOCUMENTS

JP        63128736        6/1988

* cited by examiner

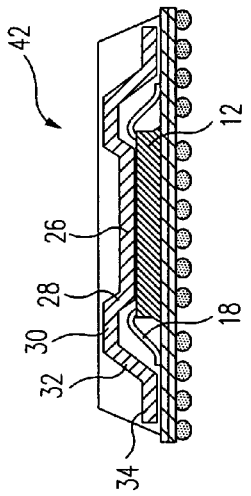
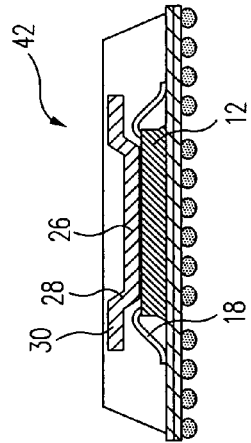
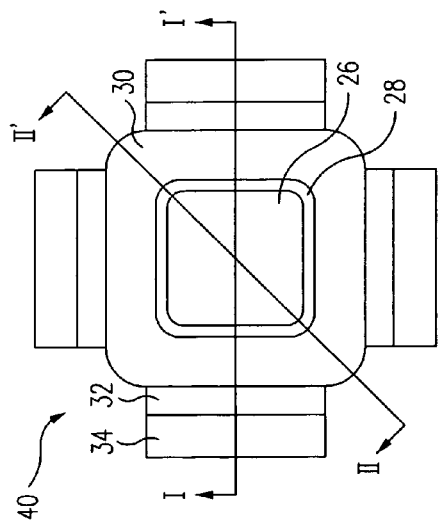
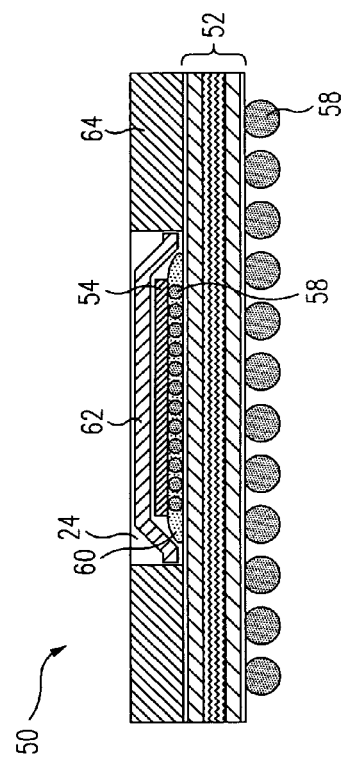

EMBEDDED HEAT SPREADER BALL GRID ARRAY

FIELD OF THE INVENTION

The present invention relates to semiconductor chip packages, and more specifically, to ball grid array packages with heat spreaders.

BACKGROUND OF THE INVENTION

In general, semiconductor packages are used to protect a semiconductor die in a package body and to provide connection points for connecting the packaged die to external devices and circuitry. Ball grid array (BGA) packages are currently used to handle the high density and high pin-count of semiconductor die. In a typical BGA package, the semiconductor die is mounted to the top surface of a printed circuit board (PCB) type substrate. The die is wire bonded to electrical traces on the top surface of the substrate. The bond wires and die are then typically encapsulated for protection. Solder balls are bonded to the electrical traces on the bottom surface of the substrate to provide electrical connection to an underlying device, such as a PCB.

During operation of the integrated circuit, heat is generated by the die which must be removed from the package. Many packages use heat dissipation elements, such as heat slugs, heat spreaders, and heat sinks, attached or coupled to the die. These elements can be made of materials, such as aluminum, copper, steel, and alloys, which spread and remove the heat from the device.

With a cavity-down configuration, in which the die face is facing down towards the ball grid array, the die and bond wires are encapsulated in the cavity, and a heat dissipation element is typically attached to the back side of the die to form the top of the chip package. These types of configurations have high package or substrate profiles as well as high assembly costs. With a cavity-up configuration, in which the die face is facing up and away from the ball grid array, a chip lid is secured over the die and bond wires to dissipate heat generated by the circuit. However, these "drop-in" lids result in a high thermal resistance between the die and the heat spreader.

Accordingly, a ball grid array package with a heat dissipating element is desired without the disadvantages discussed above with conventional packages.

SUMMARY OF THE INVENTION

In accordance one aspect of the invention, a high thermal conductivity heat spreader or slug is attached directly to the face of a cavity-up ball grid array (BGA) package with a thin adhesive layer. The heat spreader and underlying die are then completely enclosed by an encapsulant.

In one embodiment, the shape of the heat spreader approximately conforms to the topographical profile of the underlying die, substrate, and die-to-substrate connections, such as bond wires, where the outer portions of the heat spreader substantially overlie all exposed areas of the substrate. In another embodiment, the outer portions of the heat spreader only overlie portions of the substrate extending from the four sides of the die, i.e., the corner portions of the substrate remain exposed.

Attaching the heat spreader directly to the die surface results in a very low thermal resistance at interface between the die and heat spreader. The design of the heat spreader then allows heat to be spread laterally in the package and dissipated through the top and bottom surfaces of the package. Completely embedding the heat spreader in the encapsulant with only a thin layer of material over the upper portions of the heat spreader and between the heat spreader and the substrate accommodates mechanical tolerance stackup of die thickness, bondline thickness, and heat spreader thickness without sacrificing thermal performance. This also maximizes the available area for package marking and improves the cosmetic appearance of the package.

The present invention will be more fully understood when taken in light of the following detailed description taken together with the accompanying drawings.

BRIEF DESCRIPTION OF THE DRAWINGS

FIG. 3A is a top view of a heat spreader according to another embodiment of the invention.

FIG. 3B is a side view of a BGA package and the heat spreader of FIG. 3A along sectional line I–I'.

FIG. 3C is a side view of a BGA package and the heat spreader of FIG. 3A along sectional line II–II'.

FIG. 4 is a side view of a flip chip BGA package according to another embodiment of the present invention.

Use of the same or similar reference numbers in different figures indicates same or like elements.

DESCRIPTION OF THE PREFERRED EMBODIMENTS

In accordance with one aspect of the present invention, a heat spreader or slug is attached directly to the face of a die in a die-up ball grid array (BGA) package and the heat slug, die, and bond wires completely encapsulated.

Figure 1:
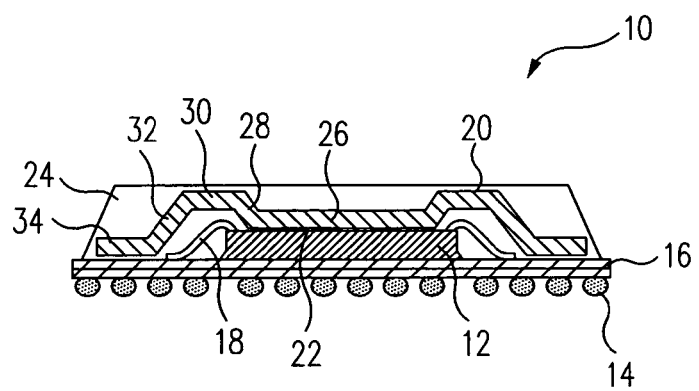
FIG. 1 is side view of a ball grid array (BGA) package according to one embodiment of the present invention.

FIG. 1 is a side view of a BGA package 10 according to one embodiment of the present invention. BGA package 10 includes a semiconductor die 12 and an array of solder balls 14 electrically coupled to a substrate 16. Substrate 16 includes (not shown) multiple patterned dielectric and conductive layers, with vias and other interconnections providing connections between the various layers and to the top and bottom surfaces of the substrate. Die 12 is attached to the upper surface of substrate 16, such as by a silver epoxy, and electrically connected to traces on the upper surface of substrate 16, such as with bond wires 18. Solder balls 14 are set on the bottom surface of substrate 16 to provide electrical connection between external circuitry, such as a printed circuit board (not shown), and die 12.

A heat spreader or slug 20 is then attached to the upper or active surface of die 12, such as with a thin adhesive 22 (e.g., on the order of 1 mil or less). The thin layer of adhesive provides a very low thermal resistance between the heat generating portion of die 12 and heat spreader 20. Adhesive 22 can be filled with a material, such as silver, for increased thermal conductivity, provided that the reliability of the interface between die 12 and heat spreader 20 is maintained. Heat spreader 20 is formed from a material with high thermal conductivity or heat transfer coefficient, such as, but not limited to, copper, copper/molybdenum alloys, copper/tungsten alloys, aluminum, aluminum nitride, beryllium oxide, and steel.

After adhesive 22 is cured, die 12, bond wires 18, and heat spreader 20 are encapsulated using a conventional process, such as transfer molding or an encapsulant dispense process.

For example, a dielectric material, such as an uncured silica or glass filled epoxy, is formed over die 12, bond wires 18, and heat spreader 20. A thin layer (e.g., 6±3 mil) of epoxy covers the uppermost surface of heat spreader 20. The epoxy is then heated and cured, resulting in an encapsulant 24 that completely covers heat spreader 20.

Figure 2:
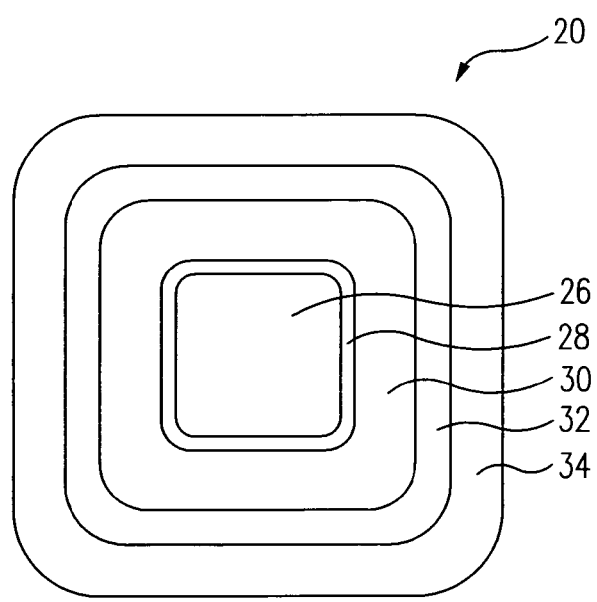
FIG. 2 is a top view of a heat spreader from the BGA package of FIG. 1, according to one embodiment.

As seen from FIG. 1, heat spreader 20 is shaped to approximately conform to the profile of the underlying structure. In this example, heat spreader 20 has an interior portion 26 that is approximately parallel to the face of die 12, a first angled portion 28 that extends upwards away from die 12, an upper portion 30 that flattens out above the top of bond wires 18, a second angled portion 32 that extends approximately along bond wires 18, and an outer portion 34 that is approximately parallel to the upper surface of substrate 16. Other shapes are also suitable, provided only a thin adhesive attaches the heat spreader to the die face. In some embodiments, the portion of heat spreader 20 directly over the die is approximately 10 mil in thickness. FIG. 2 is a top view of one embodiment of heat spreader 20. In this embodiment, heat spreader 20 is rectangular or square shaped and overlies substantially all of the exposed upper surface of substrate 16. This design maximizes heat transfer capability due to a large flange area that extends to outer portions of substrate 16.

FIG. 3A is a top view of another embodiment of a heat spreader 40 according to the present invention. FIGS. 3B and 3C are side views of a BGA package 42 using heat spreader 40 of FIG. 3A. Heat spreader 40 shown in FIGS. 3B and 3C is along sectional lines I–I' and II–II', respectively, of FIG. 3A. Similar to heat spreader 20 of FIGS. 1 and 2, heat spreader 40 has interior portion 26 overlying the face of die 12, first angled portion 28 that extends upwards away from die 12, and upper portion 30 that flattens out above the top of bond wires 18. However, second angled portion 32 and outer portion 34 of heat spreader 40 only extend laterally from the sides of upper portion 30, instead of along the entire circumference of upper portion 30 as in FIG. 2. Thus, as compared with heat spreader 20 of FIGS. 1 and 2, heat spreader 40 of FIGS. 3A–3C has a smaller flange area, but is likely to have better mold process yields due to better cavity-fill characteristics.

While the above embodiments describe a heat spreader attached to the face of a die, advantages of the present invention can also be obtained by attaching a heat spreader to the back of a die, as shown in FIG. 4. FIG. 4 is a side view of a flip chip BGA package 50 according to another embodiment of the invention. Flip chip BGA package 50 includes a multi-layer substrate 52 in which electrical connections can be made between the upper and lower surfaces of substrate 52, such as with vias and traces (not shown). A face down die 54 is electrically coupled to the upper surface of substrate 52, such as through solder bumps 56. An array of solder balls 58 allows signals from die 54 to be coupled to external circuitry, such as an underlying PCB. Package 50 can be underfilled with an epoxy resin 60 for relieving stresses resulting from the thermal mismatch between die 54 and substrate 52 and for preventing moisture from reaching the active surface or face of die 54.

A heat slug or spreader 62 is attached directly to the back of die 54, such as with an adhesive as discussed above. A stiffener ring 64 or other suitable layer is attached to substrate 52 such that the top surface of ring 64 is slightly above the top of heat spreader 62. An encapsulant 24, such as an epoxy, then completely covers die 54 and heat spreader 62.

The above-described embodiments of the present invention are merely meant to be illustrative and not limiting. It will thus be obvious to those skilled in the art that various changes and modifications may be made without departing from this invention in its broader aspects. For example, although the heat spreaders discussed above are shown as solid elements, slots can be added to the heat spreaders to improve mold flow. Further, the heat spreaders can be grounded if the electrically conductive epoxy is dispensed on the substrate surface, and the substrate has exposed metal features tied to ground. Grounding the heat spreader improves electrical performance, as well as EMI shielding. Therefore, the appended claims encompass all such changes and modifications as fall within the true spirit and scope of this invention.

We claim:

1. A semiconductor die package, comprising:
   a substrate having a first and a second surface;
   a die having a first surface and a second surface, wherein the first surface of the die is attached to the first surface of the substrate;
   a heat spreader attached to the second surface of the die, wherein the heat spreader comprises:
      an interior planar portion overlying and attached to the die;
      an outer planar portion overlying and attached to at least a portion of the substrate, wherein the outer planar portion overlies substantially all of the substrate; and
      a first angled portion extending from the outer planar portion towards the second surface of the die; and
   an encapsulant completely enclosing the die and the heat spreader.

2. The die package of claim 1, wherein the second surface of the die is the face containing active circuitry.

3. The die package of claim 2, wherein the second surface of the die is electrically coupled to the first surface of the substrate.

4. The die package of claim 3, wherein bond wires electrically couple the second surface of the die to the first surface of the substrate.

5. The die package of claim 1, further comprising a conductive ball grid array coupled to the second surface of the substrate.

6. The die package of claim 1, further comprising a thin layer of thermal conductive adhesive between the die and the heat spreader.

7. The die package of claim 6, wherein the thin layer is of the order of approximately 1 mil or less.

8. The die package of claim 1, wherein the encapsulant covering an uppermost portion of the heat spreader is no more than 9 mils thick.

9. The die package of claim 1, wherein the outer planar portion only overlies portions of the substrate in a direction extending laterally from the four sides of the die.

10. The die package of claim 1, wherein the first surface of the die is the face containing active circuitry.

11. The die package of claim 10, wherein the first surface of the die is electrically coupled to the first surface of the substrate.

12. The die package of claim 11, wherein an array of solder bumps electrically couple the first surface of the die to the first surface of the substrate.

13. The die package of claim 1, wherein a thin layer of encapsulant is located between the outer planar portion of the heat spreader and the first surface of the substrate.

14. A ball grid array (BGA) package, comprising:
a substrate including a ball grid array;
a die coupled to the substrate;
a thin thermal conductive adhesive layer on the die;
a heat spreader attached to the die with the adhesive layer, wherein the heat spreader comprises:
an interior planar portion overlying and attached to the die;
an outer planar portion overlying and attached to at least a portion of the substrate; and
a first angled portion extending from the outer planar portion towards an upper surface of the die; and
an encapsulant completely covering the heat spreader, wherein the heat spreader includes a depressed region opposite a surface of the heat spreader that is attached to an active surface of the die, the depressed region being filled with the encapsulant.

15. The BGA package of claim 14 wherein the encapsulant covering an uppermost portion of the heat spreader is no more than 9 mils thick.

16. The BGA package of claim 14, wherein a thin layer of encapsulant is located between the outer planar portion of the heat spreader and the upper surface of the substrate.

17. A method of dissipating heat from a ball grid array package, comprising:
attaching a die to a substrate including a ball grid array;
attaching a heat spreader directly to the die, wherein the heat spreader comprises:
an interior planar portion overlying and attached to the die;
an outer planar portion overlying and attached to at least a portion of the substrate, wherein the outer planar portion overlies substantially all of the substrate; and
a first angled portion extending from the outer planar portion towards an upper surface of the die; and
encapsulating the die and the heat spreader completely.

18. The method of claim 17, further comprising forming a thin layer of encapsulant between an outer portion of the heat spreader and a surface of the substrate.

19. A method of packaging a semiconductor die, comprising:
providing a substrate;
attaching a first surface of the die to the substrate;
attaching a heat spreader directly to a second surface of the die, the second surface opposing the first surface, wherein the heat spreader comprises:
an interior planar portion overlying and attached to the die;
an outer planar portion overlying and attached to at least a portion of the substrate, wherein the outer planar portion overlies substantially all of the substrate; and
a first angled portion extending from the outer planar portion towards the second surface of the die; and
completely covering the heat spreader with an encapsulant.

20. The die package of claim 1, wherein the heat spreader contacts the first surface of the substrate.

21. The die package of claim 20, further comprising bond wires electrically coupling the second surface of the die to the substrate, wherein the heat spreader superimposes the bond wires.

22. The die package of claim 2, further comprising bond wires electrically coupling the second surface of the die to the substrate, wherein the heat spreader superimposes the bond wires.

23. The die package of claim 22, wherein the heat spreader contacts the substrate.

24. A semiconductor die package, comprising:
a substrate having a first and a second surface;
a die having a first surface and a second surface, wherein the first surface of the die is attached to the first surface of the substrate and the second surface of the die is the face containing active circuitry;
a heat spreader attached to the second surface of the die, wherein the die has four peripheral sides, and the heat spreader contacts the substrate adjacent each of the four peripheral sides, the heat spreader comprising:
an interior planar portion overlying and attached to the die;
an outer planar portion overlying and attached to at least a portion of the substrate; and
a first angled portion extending from the outer planar portion towards the second surface of the die; and
an encapsulant completely enclosing the die and the heat spreader; and
bond wires electrically coupling the second surface of the die to the substrate, wherein the heat spreader superimposes the bond wires.

25. The die package of claim 23, wherein the die has four peripheral sides, and the heat spreader contacts the substrate adjacent some but not all of the four peripheral sides.

26. The die package of claim 1, wherein the second surface of the die includes bond pads electrically coupled to the substrate, and the heat spreader contacts the second surface of the die within a perimeter of the bond pads.

27. The die package of claim 26, wherein the bond pads are each electrically coupled to the substrate by one of a plurality of bond wires, and the heat spreader superimposes the bond wires.

28. The die package of claim 27, wherein the heat spreader contacts the substrate outward of a connection between the respective bond wires and the substrate.

29. A semiconductor die package, comprising:
a substrate having a first and a second surface;
a die having a first surface and a second surface, wherein the first surface of the die is attached to the first surface of the substrate;
a heat spreader attached to the second surface of the die, wherein the second surface of the die includes bond pads electrically coupled to the substrate by one of a plurality of bond wires, and the heat spreader contacts the second surface of the die within a perimeter of the bond pads and superimposes the bond wires, and wherein the heat spreader does not contact the substrate, the heat spreader comprising:
an interior planar portion overlying and attached to the die;
an outer planar portion overlying and attached to at least a portion of the substrate; and
a first angled portion extending from the outer planar portion towards the second surface of the die; and
an encapsulant completely enclosing the die and the heat spreader.

30. The die package of claim 1, further comprising a metal ring coupled to the first surface of the substrate around the die and the heat spreader.

31. The die package of claim 30, wherein the die is in a flip chip connection with the first surface of the substrate.

32. The die package of claim 1, wherein the second surface of the die includes active circuitry, and bond pads electrically coupled to the substrate.

33. A semiconductor die package, comprising:
a substrate having a first and a second surface;
a die having a first surface and a second surface, wherein the first surface of the die is attached to the first surface of the substrate;
a heat spreader attached to the second surface of the die, wherein the heat spreader comprises:
  an interior planar portion overlying and attached to the die;
  an outer planar portion overlying and attached to at least a portion of the substrate, wherein the outer planar portion overlies substantially all of the substrate; and
  a first angled portion extending from the outer planar portion towards the second surface of the die; and
an encapsulant completely enclosing the die and the heat spreader.

34. The BGA package of claim 14, wherein the die includes an active surface with bond pads thereon, the heat spreader is attached to the active surface within a perimeter of the bond pads.

35. The BGA package of claim 34, wherein the bond pads are electrically coupled to the substrate using bond wires, and the heat spreader arches over the bond wires.

36. The BGA package of claim 35, wherein the heat spreader is attached to the substrate.

37. A ball grid array (BGA) package, comprising:
a substrate including a ball grid array;
a die coupled to the substrate;
a thin thermal conductive adhesive layer on the die;
a heat spreader attached to the die with the adhesive layer, wherein the heat spreader comprises:
  an interior planar portion overlying and attached to the die;
  an outer planar portion overlying and attached to at least a portion of the substrate, wherein the outer planar portion overlies substantially all of the substrate; and
  a first angled portion extending from the outer planar portion towards an upper surface of the die; and
an encapsulant completely covering the heat spreader.

38. The method of claim 17, wherein the heat spreader is coupled to a surface of the die that includes a plurality of bond pads, the bond pads being electrically coupled to the substrate.

39. The method of claim 19, further comprising bond wires electrically coupling the second surface of the die to the substrate, wherein the heat spreader superimposes the bond wires.

40. The method of claim 19, wherein a thickness of the encapsulant between an outer surface of the encapsulant and a closest portion of the heat spreader is no more than 9 mils.

41. The method of claim 40, wherein a plurality of bond wires are electrically coupled to the second surface of the die, and the heat spreader superimposes the bond wires.

42. The method of claim 41, wherein a plurality of bond wires are electrically coupled to the second surface of the die, the heat spreader superimposes the bond wires, and the heat spreader is attached to the substrate.

43. The die package of claim 1, wherein the encapsulant covering an uppermost portion of the heat spreader is approximately 9 mils thick.

44. The BGA package of claim 14, wherein the encapsulant covering an uppermost portion of the heat spreader is approximately 9 mils thick.

45. The method of claim 17, wherein the encapsulant covering an uppermost portion of the heat spreader is approximately 9 mils thick.

46. The method of claim 19, wherein a thickness of the encapsulant between an outer surface of the encapsulant and a closest portion of the heat spreader is approximately 9 mils.

47. The die package of claim 33, wherein a thickness of the encapsulant between an outer surface of the encapsulant and a closest portion of the heat spreader is no more than 9 mils.

48. The BGA package of claim 37, wherein a thickness of the encapsulant between an outer surface of the encapsulant and a closest portion of the heat spreader is no more than 9 mils.

* * * * *